(12) United States Patent
Mukaida

(10) Patent No.: US 8,421,207 B2
(45) Date of Patent: Apr. 16, 2013

(54) SEMICONDUCTOR DEVICE, ELECTRONIC APPARATUS, AND MANUFACTURING METHODS THEREOF

(75) Inventor: Hideko Mukaida, Kunitachi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 170 days.

(21) Appl. No.: 12/881,386

(22) Filed: Sep. 14, 2010

(65) Prior Publication Data

US 2011/0073975 A1    Mar. 31, 2011

(30) Foreign Application Priority Data

Sep. 30, 2009  (JP) .................................. 2009-227208

(51) Int. Cl.
*H01L 23/492*    (2006.01)

(52) U.S. Cl.
USPC ................ 257/692; 257/434; 257/E31.127; 438/64

(58) Field of Classification Search ............ 257/432, 257/434, 692, E31.127; 438/64, 65
See application file for complete search history.

(56) References Cited

U.S. PATENT DOCUMENTS

| | | | |
|---|---|---|---|
| 7,091,599 B2 | 8/2006 | Fujimori | |
| 7,898,085 B2 | 3/2011 | Fujimori | |
| 7,968,961 B2 * | 6/2011 | Yamamoto | 257/433 |
| 8,013,350 B2 * | 9/2011 | Itoi et al. | 257/98 |
| 8,048,708 B2 * | 11/2011 | Borthakur et al. | 438/64 |
| 2004/0130640 A1 * | 7/2004 | Fujimori | 348/294 |
| 2008/0277752 A1 * | 11/2008 | Fujita et al. | 257/434 |
| 2009/0294779 A1 * | 12/2009 | Ida et al. | 257/82 |
| 2009/0321863 A1 * | 12/2009 | Borthakur et al. | 257/432 |
| 2010/0025791 A1 * | 2/2010 | Ogawa et al. | 257/432 |
| 2010/0117181 A1 * | 5/2010 | Kim et al. | 257/432 |
| 2011/0147873 A1 | 6/2011 | Fukuda et al. | |

FOREIGN PATENT DOCUMENTS

| | | |
|---|---|---|
| EP | 1 577 950 A1 | 9/2005 |
| JP | 2004-207461 | 7/2004 |
| JP | 2007-129164 | 5/2007 |
| JP | 2008-311423 | 12/2008 |
| JP | 2011-003828 | 1/2011 |

OTHER PUBLICATIONS

Japanese Office Action for Japanese Application No. 2009-227208 mailed on Jan. 10, 2012.
Chinese Office Action for Chinese Application No. 201010275333.7 mailed on Jul. 2, 2012.

* cited by examiner

Primary Examiner — Allan R Wilson
(74) Attorney, Agent, or Firm — Turocy & Watson, LLP

(57) ABSTRACT

According to one embodiment, a semiconductor device includes a semiconductor substrate having a first surface and a second surface at an opposite side thereof. The first surface has an active layer with a light-receiving part. The semiconductor device also includes an adhesive layer provided to surround the light-receiving part on the first surface of the semiconductor substrate; a light-transmissive protective member disposed above the light-receiving part of the semiconductor substrate with a predetermined gap and adhered via the adhesive layer; and plural external connection terminals arranged in a predetermined array on the second surface of the semiconductor substrate are included. Each center point of the external connection terminals forming two facing edges is positioned inside of an area of the adhesive layer projected on the second surface among the outermost external connection terminals.

12 Claims, 4 Drawing Sheets

SEMICONDUCTOR DEVICE, ELECTRONIC APPARATUS, AND MANUFACTURING METHODS THEREOF

CROSS-REFERENCE TO RELATED APPLICATION

This application is based upon and claims the benefit of priority from the prior Japanese Patent Application No. 2009-227208, filed on Sep. 30, 2009; the entire contents of which are incorporated herein by reference.

FIELD

Embodiments described herein relate generally to a semiconductor device such as a camera module (imaging module) and a manufacturing method thereof, and an electronic apparatus on which the semiconductor device as stated above is mounted and a manufacturing method thereof.

BACKGROUND

A semiconductor device such as a CCD (charge-coupled device) or CMOS (complimentary metal-oxide semiconductor) image sensor using a semiconductor integrated circuit technology is widely used for a digital camera and a cellular phone with a camera function and so on. It is proposed to make a sensor chip (semiconductor element) to be a chip size package (CSP) so as to correspond to miniaturization and weight saving of mounted components in the semiconductor device as stated above.

A structure in which a light-transmissive protective member such as a transparent glass member is disposed so as to cover a light-receiving part provided at a front surface of a semiconductor chip, the semiconductor chip and the light-transmissive protective member are adhered by an adhesive, a lens member is further disposed on the light-transmissive protective member, and connection terminals to mount on a substrate are provided at a back surface of the semiconductor chip is proposed as a chip-size-packaged camera module.

In the camera module having the structure as stated above, an adhesive layer is formed to surround the light-receiving part of the semiconductor chip, and has a planer shape in a square shape in which the light-receiving part is an opening part. Widths of four edges of the adhesive layer are designed to be not uniform but various. On the other hand, the connection terminals are disposed to be arranged in a grid array state on a whole area of the back surface of the semiconductor chip.

In the camera module having the structure as stated above, problems have been occurred in which the semiconductor chip is split or cracked if more than predetermined force is added to the camera module when it is mounted on the substrate. Besides, there is a case when interconnection layers are damaged though the splits and cracks do not occur at the semiconductor chip, which results in abnormal operations.

A module for an optical device having a structure in which a translucent cover is fixed at an area outside of an effective pixel area of a solid-state image sensor via an adhesive part, the effective pixel area and the translucent cover are disposed to be separated, electrode pads are embedded at the adhesive part outside of the effective pixel area, and external electrodes are connected at downward thereof, is also proposed.

However, in the module for the optical device, the external connection terminals are formed of redistributing layers in the solid-stated image sensor, and therefore, there is a possibility in which the element is split or cracked depending on a thickness and elastic modulus of the adhesive part, a thickness of the element or the like.

DETAILED DESCRIPTION

In general, according to one embodiment, a semiconductor device includes: a semiconductor substrate having a first surface and a second surface at an opposite side thereof. The first surface has an active layer with a light-receiving part. The semiconductor device also includes an adhesive layer provided to surround the light-receiving part on the first surface of the semiconductor substrate; a light-transmissive protective member disposed above the light-receiving part of the semiconductor substrate with a predetermined gap and adhered via the adhesive layer; and plural external connection terminals disposed in a predetermined arrangement on the second surface of the semiconductor substrate. Center points of the external connection terminals forming two facing edges are positioned inside of an area of the adhesive layer projected on the second surface (hereinafter, represented as a projected area of the adhesive layer) among the outermost external connection terminals.

According to another embodiment, an electrical apparatus includes: the semiconductor device; a lens module provided on the light-transmissive protective member; and amount substrate. The semiconductor device is mounted on the mount substrate via the external connection terminals.

In the semiconductor device having a structure in which the semiconductor chip and the light-transmissive protective member are adhered by an adhesive, and connection terminals are provided at the back surface of the semiconductor chip a part of the outermost connection terminals being disposed at the area corresponding to the opening portion of the adhesive layer, it has been found that stress concentration occurs at a specific area of the semiconductor chip (for example, an area corresponding to an opening portion of the adhesive layer where the outermost connection terminals are disposed) and as a result the semiconductor chip may be unable to endure it and may be split or cracked when predetermined or more force is added at the time of mounting on a substrate.

First Embodiment

Figure 1:
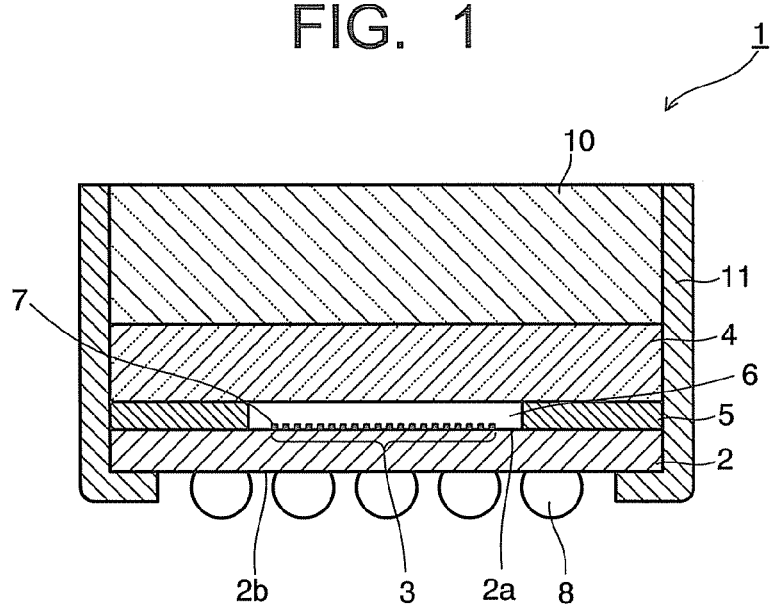
FIG. 1 is a sectional view illustrating a semiconductor device according to a first embodiment.
Figure 2:
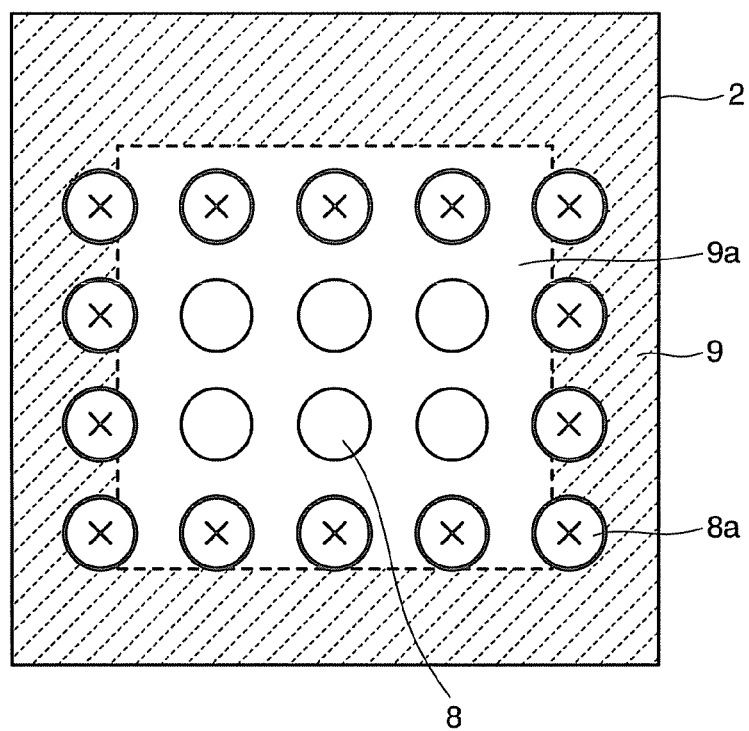
FIG. 2 is a plan view in which an adhesive layer is projected on a back surface of a semiconductor substrate (semiconductor chip) being a disposition surface of external connection terminals (hereinafter, represented as an adhesive layer projected plan view) in the semiconductor device according to the first embodiment.

FIG. 1 is a sectional view illustrating a camera module being a semiconductor device according to a first embodiment. FIG. 2 is an adhesive layer projected plan view of the semiconductor device in FIG. 1.

A semiconductor device 1 of the first embodiment includes a semiconductor substrate (semiconductor chip) 2 such as a silicon (Si) substrate. The semiconductor chip 2 has a thickness of 50 µm to 300 µm, and has an active layer at a first surface (front surface) 2a thereof. It is preferable to set the thickness of the semiconductor chip 2 from 100 µm to 200 µm. The active layer has a light-receiving part 3 collecting energy lines such as light and electrons irradiated on the front surface 2a into a photodiode. Further, the active layer has plural electrodes (not-illustrated) performing input/output of electric signals, a supply of power, and so on, and they constitute a so-called image sensor.

A light-transmissive protective member 4 such as a transparent glass member to protect the light-receiving part 3 from scratches and dust is disposed on the semiconductor chip 2 so as to cover the front surface 2a having the light-receiving part 3. The light-transmissive protective member 4 is adhered to the front surface 2a of the semiconductor chip 2 via an adhesive layer 5 disposed at a peripheral portion of the front surface 2a of the semiconductor chip 2.

The adhesive layer 5 is made up of, for example, an epoxy film adhesive, formed to surround the light-receiving part 3 formed at a center portion of the semiconductor chip 2, and has a square shape in plain view in which an opening part is formed corresponding to the light-receiving part 3. A gap 6 defined by a thickness of the adhesive layer 5 is formed between the light-transmissive protective member 4 and the front surface 2a of the semiconductor chip 2. Microlenses for light condensing 7 are formed on the light-receiving part 3, and the gap 6 is formed between the light-transmissive protective member 4 and the light-receiving part 3 so as not to spoil a condensing effect thereof.

The semiconductor chip 2 includes internal interconnections such as through electrodes (not-illustrated) connecting the front surface (first surface) 2a and a back surface (second surface) 2b, and electrically connected to the electrodes of the active layer. A back surface interconnection layer (not-illustrated) is provided at the back surface 2b of the semiconductor chip 2. Besides, the back surface 2b of the semiconductor chip 2 including the interconnection layer is covered by a protective film (not-illustrated) made up of a polyimide resin, an epoxy resin, a solder resist material, and so on, and external connection terminals 8 are provided at a terminal formation area (an opening area of the protective film) of the back surface interconnection layer. Projecting electrodes such as solder bumps are applied as the external connection terminals 8.

The external connection terminals 8 are arranged in a grid array (matrix) of, for example, three rows three columns to six rows six columns. All of center points of connection terminals 8a forming two facing edges are positioned inside of an area (projected area of adhesive layer) 9 where a formation area of the adhesive layer 5 is projected on a disposition surface of the external connection terminals 8 (the back surface of the semiconductor chip 2) among the outermost external connection terminals 8a as illustrated in FIG. 2.

A lens module 10 is attached to an upper surface of the light-transmissive protective member 4 via an adhesive layer (not-illustrated). The one in which a condenser lens is attached to a lens holder may be used as the lens module 10. Further, all of them are covered by a shielding cap 11 and so on of which object is an electrical shielding and a mechanical reinforcement.

The semiconductor device 1 of the embodiment may be, for example, manufactured as described below. At first, the active layer having the light-receiving part 3 is formed at the front surface 2a of the semiconductor substrate 2. The semiconductor substrate 2 is supplied as a semiconductor wafer, and the active layer is formed in accordance with each element configuration area of the semiconductor wafer.

Next, the adhesive layer 5 made up of, for example, the epoxy resin, the polyimide resin, an acrylic resin and so on is formed at a peripheral area except the light-receiving part 3 of the front surface 2a of the semiconductor substrate 2. Besides, the light-transmissive protective member 4 made up of a transparent glass substrate having approximately the same size as the semiconductor substrate 2 (semiconductor wafer) is prepared, and this is disposed on the semiconductor substrate 2. The light-transmissive protective member 4 and the front surface of the semiconductor substrate 2 are adhered via the adhesive layer 5 by, for example, pressurizing and heating them. The gap 6 is formed between the light-transmissive protective member 4 and the semiconductor substrate 2 depending on the thickness of the adhesive layer 5, and the light-receiving part 3 provided at the front surface 2a of the semiconductor substrate 2 is disposed to expose inside the gap 6.

Next, the back surface 2b of the semiconductor substrate 2 is processed by a mechanical grinding, a chemical mechanical polishing, a wet etching, a dry etching, and so on, to make it thin with the thickness of 100 µm to 200 µm from the back surface 2b side of the semiconductor substrate 2. Note that this manufacturing process is not necessary when the semiconductor substrate 2 which is already made thin is used, but it is preferable that a final process of the semiconductor substrate 2 is performed after the light-transmissive protective member 4 is adhered because the light-transmissive protective member 4 plays a roll of a supporting substrate mechanically reinforcing the semiconductor substrate 2.

Next, the back surface interconnection layer is formed at the back surface 2b of the semiconductor substrate 2 after the internal interconnections such as the through electrodes are formed inside of the semiconductor substrate 2. Subsequently, the external connection terminals 8 are formed at the terminal formation area of the back surface interconnection layer after the protective film is formed at the back surface 2b of the semiconductor substrate 2. The external connection terminals 8 are formed by, for example, connecting the solder balls to the back surface interconnection layer by reflowing the solder balls. The forming position of the external connection terminals 8 is designed such that all of the center points of the connection terminals 8a forming the two facing edges of the outermost external connection terminals 8a are positioned inside of the projected area 9 of the adhesive layer.

After a series of steps (wafer process), the semiconductor substrate 2 is cut by a blade and so on to be separated into pieces. The lens module 10 is then attached at upward of the light-receiving part 3 on the separated semiconductor chip 2, and the shielding cap 11 is attached to manufacture the semiconductor device 1 illustrated in FIG. 1.

Figure 3:
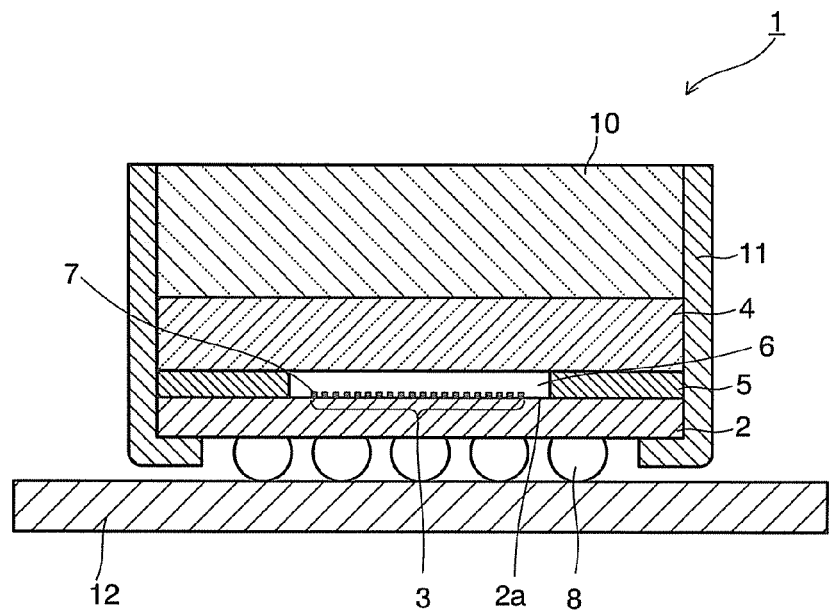
FIG. 3 is a sectional view illustrating an electronic apparatus in which the semiconductor device according to the first embodiment is mounted on a substrate.

The semiconductor device 1 of the embodiment is mounted on a mount substrate via the external connection terminals 8. An electronic apparatus on which the semiconductor device 1 is mounted is illustrated in FIG. 3. A reference numeral 12 represents a mount substrate having interconnections (not-illustrated). The mount substrate 12 is connected to devices such as a storage device and display device (not-illustrated). A digital camera, a cellular phone with a camera function, an imaging system for an electronic conference, and so on can be exemplified as the electronic apparatuses.

In the semiconductor device 1 of the present embodiment, the center points of the connection terminals 8a forming the two facing edges among the outermost external connection terminals 8a are positioned inside of the projected area 9 of the adhesive layer, and therefore, symmetrical forces act at symmetrical positions of the semiconductor chip 2 via the external connection terminals 8a disposed inside of the projected area 9 of the adhesive layer when the semiconductor device 1 is mounted on the mount substrate 12. Thus the occurrences of splits and cracks of the semiconductor chip 2 can be prevented because the stress does not locally concentrate inside of the semiconductor chip 2.

The splits and cracks occur at the semiconductor chip 2 in a structure in which the thickness of the semiconductor chip 2 is thin and a part of the outermost external connection terminals 8a exist at an opening portion 9a being out of the projected area 9 of the adhesive layer toward inside. Because a stress value received by the semiconductor chip 2 via the external connection terminals 8 when it is mounted on the mount substrate 12 exceeds a limit of occurrence of cracks and so on of the semiconductor chip 2. However, it is possible to reduce the stress value generated inside of the semiconductor chip 2 in the semiconductor module of the embodiment, and therefore, the occurrences of the splits and cracks can be prevented even in the thin semiconductor chip 2.

Second Embodiment

Figure 4:
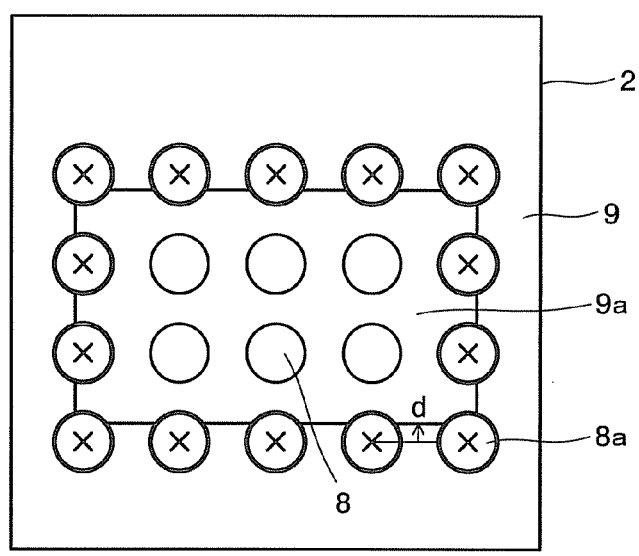
FIG. 4 is an adhesive layer projected plan view of a semiconductor device according to a second embodiment.
Figure 5:
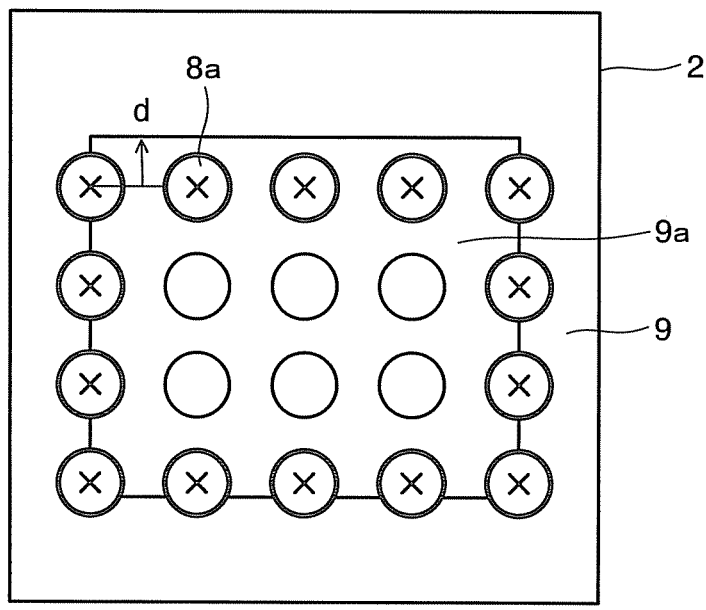
FIG. 5 is an adhesive layer projected plan view illustrating an arrangement of external connection terminals of which distance "d" from an opening edge of a projected area of an adhesive layer to a center point of an outermost external connection terminal takes a minus value.

A semiconductor device according to a second embodiment is described with reference to FIG. 4 to FIG. 6. FIG. 4 and FIG. 5 are adhesive layer projected plan views in which a formation area of the adhesive layer is projected on a disposition surface of the external connection terminals 8 in the semiconductor device according to the second embodiment.

Not all of the center points of the outermost external connection terminals 8a are positioned inside of the projected area 9 of the adhesive layer to provide the light-receiving part 3 with an enough extent in the semiconductor device 1 of the embodiment. As for each of the outermost external connection terminals 8a, the center points of which are positioned outside of the projected area 9 of the adhesive layer, a distance "d" from the center point to an opening edge of the adhesive layer projected area 9 (hereinafter, represented as an adhesive layer opening edge) is −25% or more of a diameter of the external connection terminal 8 (for example, 300 μm) as for the outermost external connection terminals 8a disposed outside of the projected area 9 of the adhesive layer.

Note that a value "d" is set to be "0" (zero) or more (plus) when the center point of the outermost external connection terminal 8a exists inside the projected area 9 of the adhesive layer as illustrated in FIG. 4, and the value "d" is set to be less than "0" (zero) (minus) when the center point of the outermost external connection terminal 8a exists at the opening portion 9a which is outside of the projected area 9 of the adhesive layer toward inside as illustrated in FIG. 5. In the second embodiment, the other portions are constituted as same as the first embodiment, and therefore, the description is not given.

In the semiconductor device 1 of the embodiment, the distance "d" from the adhesive layer opening edge to each center point of the outermost external connection terminal 8a is limited to be −25% or more of the diameter of the external connection terminal 8 as stated above, and therefore, stress concentration inside of the semiconductor chip 2 when the semiconductor device 1 is mounted on the mount substrate 12 is suppressed. Thus any splits and cracks of the semiconductor chip 2 do not occur.

Next, a relation between the distance "d" from the opening edge of the adhesive layer projected area 9 to the center point of the outermost external connection terminal 8a and the stress generated at the semiconductor chip 2 when it is mounted on the mount substrate is examined by performing a simulation.

The simulation is performed under a condition in which the thickness of the semiconductor chip 2 is 100 μm (0.1 mm), the adhesive layer 5 is formed by the epoxy film adhesive and of which thickness is 50 μm, and a diameter and a height of the solder ball being the external connection terminal 8 is 300 μm (0.3 mm), in the semiconductor device of the second embodiment.

Figure 6:
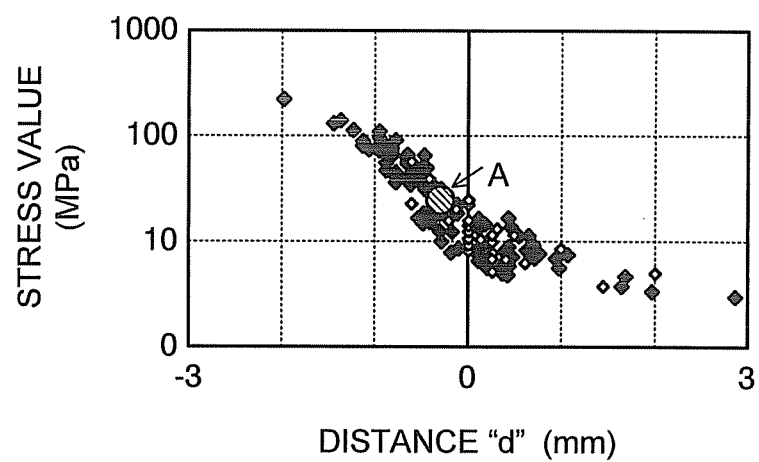
FIG. 6 is a graphic chart representing a result in which a relation between the distance "d" from the opening edge of the projected area of the adhesive layer to the center point of the outermost external connection terminal and a stress generated at the semiconductor chip is examined by a simulation in the semiconductor device according to the second embodiment.

A result of the simulation is represented in FIG. 6 by a graphic chart. A horizontal axis of the graphic chart represents the distance "d" (in millimeters) from the opening edge of the adhesive layer projected area 9 to the center point of the outermost external connection terminal 8a (unit: mm), and a vertical axis thereof represents the stress (in megapascals) added to the back surface 2b of the semiconductor chip 2. A point "A" on the graphic chart represents a stress value in which the splits or cracks occur at the semiconductor chip 2. Namely, the splits or cracks occur when the value of the stress added to the back surface 2b of the semiconductor chip 2 becomes larger than the point "A".

An approximate expression of the graphic chart illustrated in FIG. 6 is illustrated in the following.

$$\log(\sigma) = C + \frac{a}{t_{chip}} + \frac{b}{10^{d_x}} + \frac{c}{10^{d_y}} + d \times t_{adh} + e \times h_{ball} + f \times \log(E_{adh}) \quad \text{[Expression 1]}$$

In the expression, respective symbols represent the following contents.

σ: A stress value (MPa) added to the back surface of the semiconductor chip $t_{chip}$: A thickness (mm) of the semiconductor chip $d_x$: A distance (mm) in an x direction from the opening edge of the adhesive layer projected area to the center point of the outermost external connection terminal $d_y$: A distance (mm) in a y direction from the opening edge of the adhesive layer projected area to the center point of the outermost external connection terminal $t_{adh}$: A thickness (mm) of the adhesive layer $h_{ball}$: A height (mm) of the external connection terminal $E_{adh}$: A elastic modulus (MPa) of the adhesive layer A horizontal direction is set to be the x direction and a vertical direction is set to be the y direction in FIG. 5 and FIG. 6. A smaller value between the ds at right and left (two edges) is taken as the "$d_x$", and a smaller value between the $d_y$s at upper and lower two edges is taken as the "$d_y$". The symbol "C" is a constant, and the coefficients "a" to "f" are as follows: a=0.03, b=0.23, c=0.44, d=2.2, e=0.76 and f=−0.15.

In this expression, it is possible to ask the stress value "σ" added to the back surface of the semiconductor chip 2 of the semiconductor device 1 having the similar structure as the second embodiment by substituting predetermined values to the respective variables ($t_{chip}$, $d_x$, $d_y$, $t_{adh}$, $h_{ball}$, $E_{adh}$). It is possible to judge whether or not there is a possibility that the splits or cracks occur at the semiconductor chip 2 by examining whether or not the asked stress value "σ" exceeds the point "A" on the graphic chart. If the approximate expression is used, it is possible to reduce the stress added to the semiconductor chip by optimally combining the other variables such as the thickness of the semiconductor chip, the thickness and the elastic modulus of the adhesive layer, the height of the external connection terminal if the approximate expression is used when the stress cannot be reduced because of a limitation of a pixel area range only by the "$d_x$" and the "$d_y$".

In the semiconductor device 1 of the present embodiment, the distance "d" from the opening edge of the projected area 9 of the adhesive layer to each center point of the outermost external connection terminals 8a is limited to be −25% or more of the diameter of the external connection terminal 8. It is verified that the stress value "σ" does not exceed the point "A" on the graphic chart when the stress value "σ" added to the back surface of the semiconductor chip 2 is calculated by substituting each value to the expression.

Third Embodiment

Figure 7:
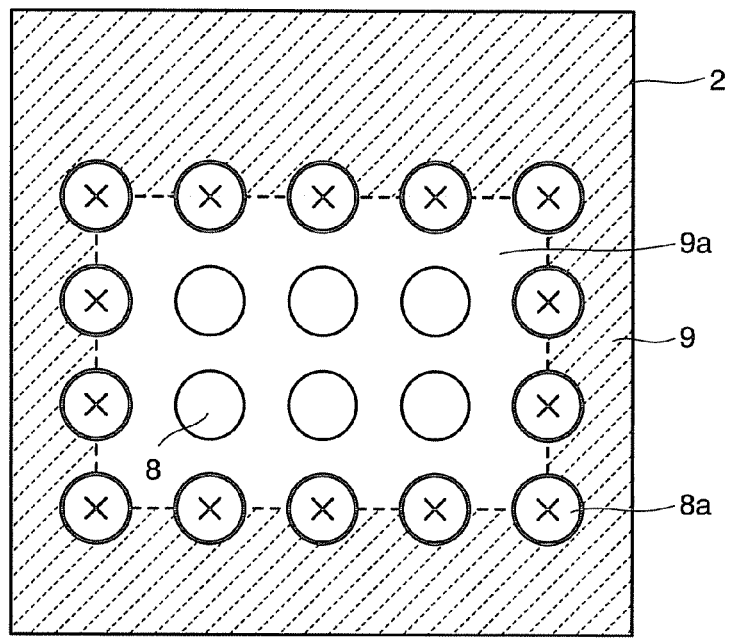
FIG. 7 is an adhesive layer projected plan view of a semiconductor device according to a third embodiment.

FIG. 7 is an adhesive layer projected plan view in which the formation area of the adhesive layer is projected on the disposition surface of the external connection terminals in a semiconductor device according to a third embodiment.

In the semiconductor device, all of the center points of the outermost external connection terminals 8a are positioned inside of the projected area 9 of the adhesive layer. The other portions are constituted as same as the first embodiment, and the description is not given.

In this semiconductor device, forces dispersed evenly to all of the four edges of the outermost external connection terminals 8a are added to the semiconductor chip 2 when it is mounted on the mount substrate. Namely, the forces dispersed more evenly via all over the outermost external connection terminals 8a at the four edges are added to the semiconductor chip 2. Accordingly, it is possible to further suppress the concentration of the stress inside of the semiconductor chip 2 and to further prevent the occurrences of the splits and cracks of the semiconductor chip 2 compared to the first embodiment.

Fourth Embodiment

Figure 8:
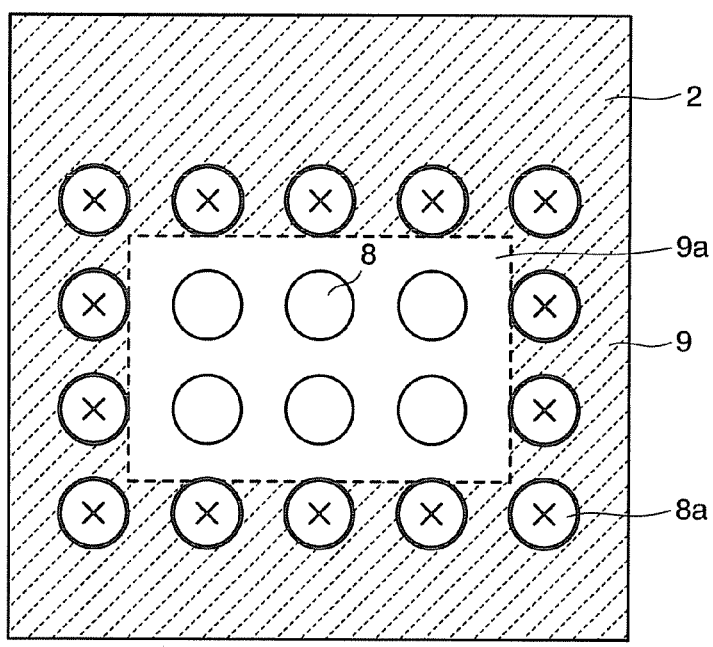
FIG. 8 is an adhesive layer projected plan view of a semiconductor device according to a fourth embodiment.

FIG. 8 is an adhesive layer projected plan view in which the formation area of the adhesive layer is projected on the disposition surface of the external connection terminals in a semiconductor device of a fourth embodiment.

In the semiconductor device, not only the center point but also a whole of every external connection terminal 8a disposed at four edges is positioned inside of the projected area 9 of the adhesive layer. The other portions are constituted as same as the first embodiment, and the description thereof is not given.

In the semiconductor device, it is possible to prevent the stress concentration inside of the semiconductor chip 2 resulting from the forces added via the external connection terminals 8 when it is mounted on the mount substrate. Accordingly, the occurrences of the splits and cracks of the semiconductor chip 2 can be prevented.

While certain embodiments have been described, these embodiments have been presented by way of example only, and are not intended to limit the scope of the inventions. Indeed, the novel devices and methods described herein may be embodied in a variety of other forms; furthermore, various omissions, substitutions, and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
a semiconductor substrate having a first surface and a second surface at an opposite side thereof, the first surface having an active layer with a light-receiving part;
an adhesive layer provided to surround the light-receiving part on the first surface of the semiconductor substrate;
a light-transmissive protective member disposed above the light-receiving part of the semiconductor substrate with a predetermined gap and adhered via the adhesive layer; and
plural external connection terminals arranged in a matrix on the second surface of the semiconductor substrate,
wherein each center point of the external connection terminals on two facing lines is positioned inside of an area of the adhesive layer projected on the second surface (hereinafter, referred to as a projected area of the adhesive layer), and each center point of the external connection terminals other than the external connection terminals on the two lines is positioned outside of the projected area of the adhesive layer, among the outermost external connection terminals.

2. The semiconductor device according to claim 1, wherein at least one of the outermost external connection terminals other than the external connection terminals on the two lines has a distance "d" from the center point to an opening edge surrounding the light-receiving part of the projected area of the adhesive layer of −25% or more of a diameter of the external connection terminal.

3. The semiconductor device according to claim 1, wherein a distance "d" from each center point of the external connection terminals on at least one line other than the two lines to the opening edge surrounding the light-receiving part of the projected area of the adhesive layer is −25% or more of the diameter of the external connection terminal among the outermost external connection terminals.

4. The semiconductor device according to claim 1, wherein a distance "d" from each center point of the outermost external connection terminals other than the external connection terminals on the two lines to the opening edge surrounding the light-receiving part of the projected area of the adhesive layer is −25% or more of the diameter of the external connection terminal.

5. The semiconductor device according to claim 1, wherein each center point of the outermost external connection terminals is positioned inside of the projected area of the adhesive layer.

6. The semiconductor device according to claim 1, wherein a whole of each of the outermost external connection terminals is positioned inside of the projected area of the adhesive layer.

7. The semiconductor device according to claim 1, wherein a whole of each of the external connection terminals other than the outermost external connection terminals is positioned outside of the projected area of the adhesive layer.

8. The semiconductor device according to claim 1, wherein the external connection terminals are arranged in a matrix of three rows three columns to six rows six columns.

9. The semiconductor device according to claim 1, wherein the semiconductor substrate has a thickness of 50 μm to 300 μm.

10. The semiconductor device according to claim 1, wherein a shape of the light-receiving part is a rectangular.

11. The semiconductor device according to claim 1, wherein the adhesive layer is made up of at least one selected from an epoxy resin, a polyimide resin, and an acrylic resin.

12. An electronic apparatus, comprising:
a semiconductor device including:
  a semiconductor substrate having a first surface and a second surface at an opposite side thereof, the first surface having an active layer with a light-receiving part;
  an adhesive layer provided to surround the light-receiving part on the first surface of the semiconductor substrate;
  a light-transmissive protective member disposed above the light-receiving part of the semiconductor substrate with a predetermined gap and adhered via the adhesive layer; and
  plural external connection terminals arranged in a matrix on the second surface of the semiconductor substrate,
  wherein each center point of the external connection terminals on two facing lines is positioned inside of a projected area of the adhesive layer, and each center point of the external connection terminals other than the external connection terminals on the two lines is positioned outside of the projected area of the adhesive layer, among the outermost external connection terminals;
a lens module provided on the light-transmissive protective member of the semiconductor device; and
a mount substrate,
wherein the semiconductor device is mounted on the mount substrate via the external connection terminals.

* * * * *